US006331943B1

(12) United States Patent
Naji et al.

(10) Patent No.: US 6,331,943 B1
(45) Date of Patent: Dec. 18, 2001

(54) MTJ MRAM SERIES-PARALLEL ARCHITECTURE

(75) Inventors: Peter K. Naji, Phoenix; Mark DeHerrera, Tempe; Mark Durlam, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/649,117

(22) Filed: Aug. 28, 2000

(51) Int. Cl.[7] ............................................ G11C 11/00
(52) U.S. Cl. ................................. 365/158; 365/171
(58) Field of Search .................................. 365/158, 171, 365/173

(56) References Cited

U.S. PATENT DOCUMENTS

| | | | | |
|---|---|---|---|---|
| 5,699,293 | * | 12/1997 | Tehrani et al. | 365/158 |
| 5,940,319 | * | 8/1999 | Durlam et al. | 365/171 |
| 5,978,257 | * | 11/1999 | Zhu et al. | 365/173 |
| 6,055,179 | * | 8/2000 | Koganei et al. | 365/158 |
| 6,172,903 | * | 1/2001 | Nishimura et al. | 365/158 |

* cited by examiner

*Primary Examiner*—Son T. Dinh
(74) *Attorney, Agent, or Firm*—William E. Koch (57) ABSTRACT

Magnetic tunnel junction random access memory architecture in which an array of memory cells is arranged in rows and columns and each memory cell includes a magnetic tunnel junction and a control transistor connected in parallel. A control line is connected to the gate of each control transistor in a row of control transistors and a metal programming line extending adjacent to each magnetic tunnel junction is connected to the control line in spaced apart intervals by vias. Further, groups of memory cells in each column are connected in series to form local bit lines which are connected in parallel to global bit lines. The series-parallel configuration is read using a centrally located column to provide a reference signal and data from columns on each side of the reference column is compared to the reference signal or two columns in proximity are differentially compared.

23 Claims, 9 Drawing Sheets

MTJ MRAM SERIES-PARALLEL ARCHITECTURE

FIELD OF THE INVENTION

The present invention relates in general to Magnetoresistive Random Access Memories (MRAMs), and more particularly to magnetic tunnel junction (MTJ) MRAM arrays and a specific architecture for connecting the arrays.

BACKGROUND OF THE INVENTION

The architecture for Magnetoresistive Random Access Memory (MRAM) is composed of a plurality or array of memory cells and a plurality of digit and bit line intersections. The magnetoresistive memory cell generally used is composed of a magnetic tunnel junction (MTJ), an isolation transistor, and the intersection of digit and bit lines. The isolation transistor is generally a N-channel field effect transistor (FET). An interconnect stack connects the isolation transistor to the MTJ device, to the bit line, and to the digit line used to create part of the magnetic field for programming the MRAM cell.

MTJ memory cells generally include a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer, to point in either of two directions. An MTJ cell is used by connecting it in a circuit such that electricity flows vertically through the cell from one of the layers to the other. The MTJ cell can be electrically represented as a resistor and the size of the resistance depends upon the orientation of the magnetic vectors. As is understood by those skilled in the art, the MTJ cell has a relatively high resistance when the magnetic vectors are misaligned (point in opposite directions) and a relatively low resistance when the magnetic vectors are aligned.

It is of course desirable to have the low resistance (aligned vectors) as low as possible, and the high resistance (misaligned vectors) much higher than the low resistance so that the change can be easily detected in associated electronic circuitry. The difference between the high and low resistance is generally referred to as the magnetic ratio (MR) with the difference generally being expressed in a percent (%), hereinafter the MR%.

Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

A bit line is generally associated with each column of an array of MTJ cells and a digit line is associated with each row of the array. The bit lines and digit lines are used to address individual cells in the array for both reading and programming or storing information in the array. Programming of a selected cell is accomplished by passing predetermined currents through the digit and bit lines intersecting at the selected cell. Several problems are prevalent in the standard memory architecture, including high programming or read currents, insufficient spacing between cells during programming, difficulty in sensing resistance changes because of long and/or high resistance bit and digit lines, and poor speed (generally in reading stored data).

Thus, it is desirable to provide architectures for MRAM memories that overcome some or all of these problems.

BRIEF DESCRIPTION OF THE DRAWINGS

The specific objects and advantages of the present invention will become readily apparent to those skilled in the art from the following detailed description thereof taken in conjunction with the drawings in which.

DESCRIPTION OF THE PREFERRED EMBODIMENTS

Figure 1:
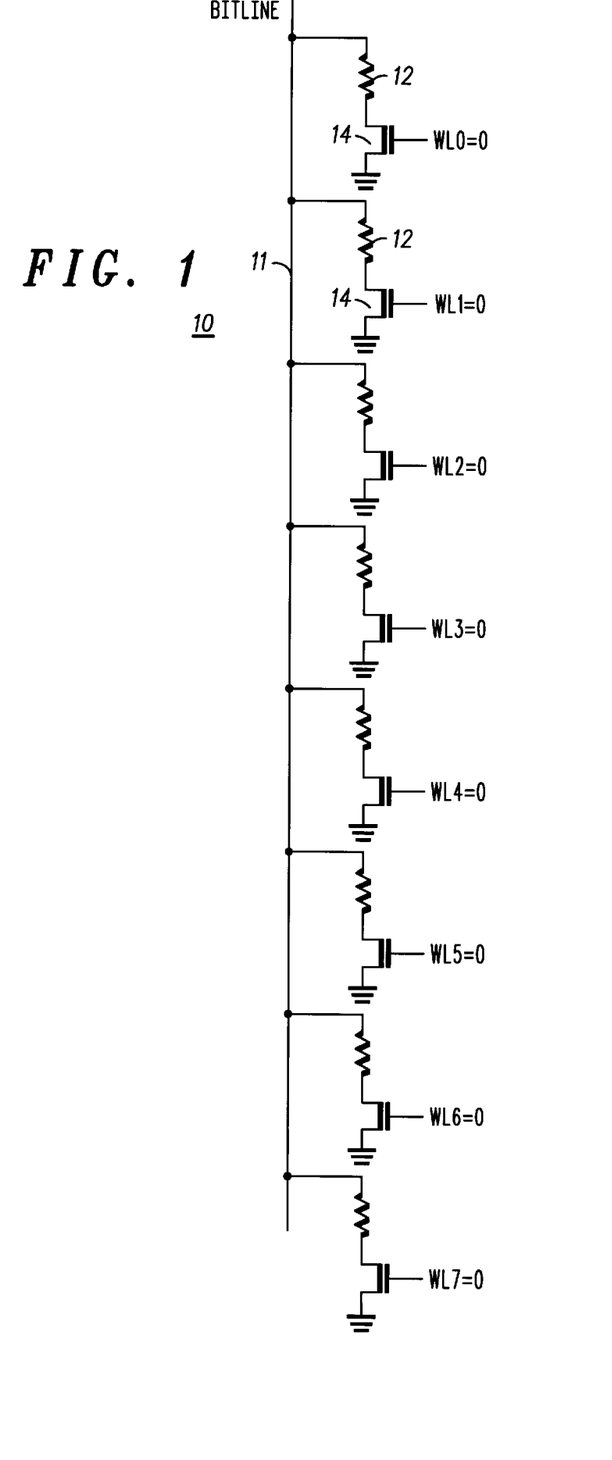
FIG. 1 is a schematic diagram of an MTJ memory array, portions thereof removed, connected in a common parallel architecture.

Turning to FIG. 1, a schematic diagram of an MTJ memory array 10 connected in a common parallel architecture is illustrated. Throughout this disclosure MTJ memory cells will be depicted as a simple resistor or a variable resistor to simplify the drawings and disclosure. A single column of MTJ memory cells from array 10 are illustrated in FIG. 1, since each of the other columns will be similar and need not be described individually. The single column includes a bitline 11 coupled to one terminal of each MTJ cell 12 in the column. Each MTJ cell has a control transistor 14 connected to a second terminal and to a common junction, such as ground. Thus, each MTJ cell 12 in the column and its associated control transistor 14 is connected in parallel between bitline 11 and ground. Wordlines, WL0, WL1, WL2, etc., extending along the rows of MTJ cells are connected to the gate of each transistor 14 in a row.

To read a bit of stored data, a column select transistor (not shown) is activated to select a specific column and a selected wordline is activated to turn on a specific transistor 14. Since only the specific transistor 14 associated with a selected MTJ cell 12 is activated, only the selected MTJ cell is connected to the selected bitline 11. Generally, during a read operation a first bitline 11 will be activated and the wordlines will then be sampled sequentially from WL0 to WLn. When this architecture is used in a random access memory (RAM), selected bits can be addressed by selecting appropriate bitlines and wordlines. The problems with this architecture clearly are that accessing stored data is relatively slow and the MTJ array is unnecessarily large.

Figure 2:
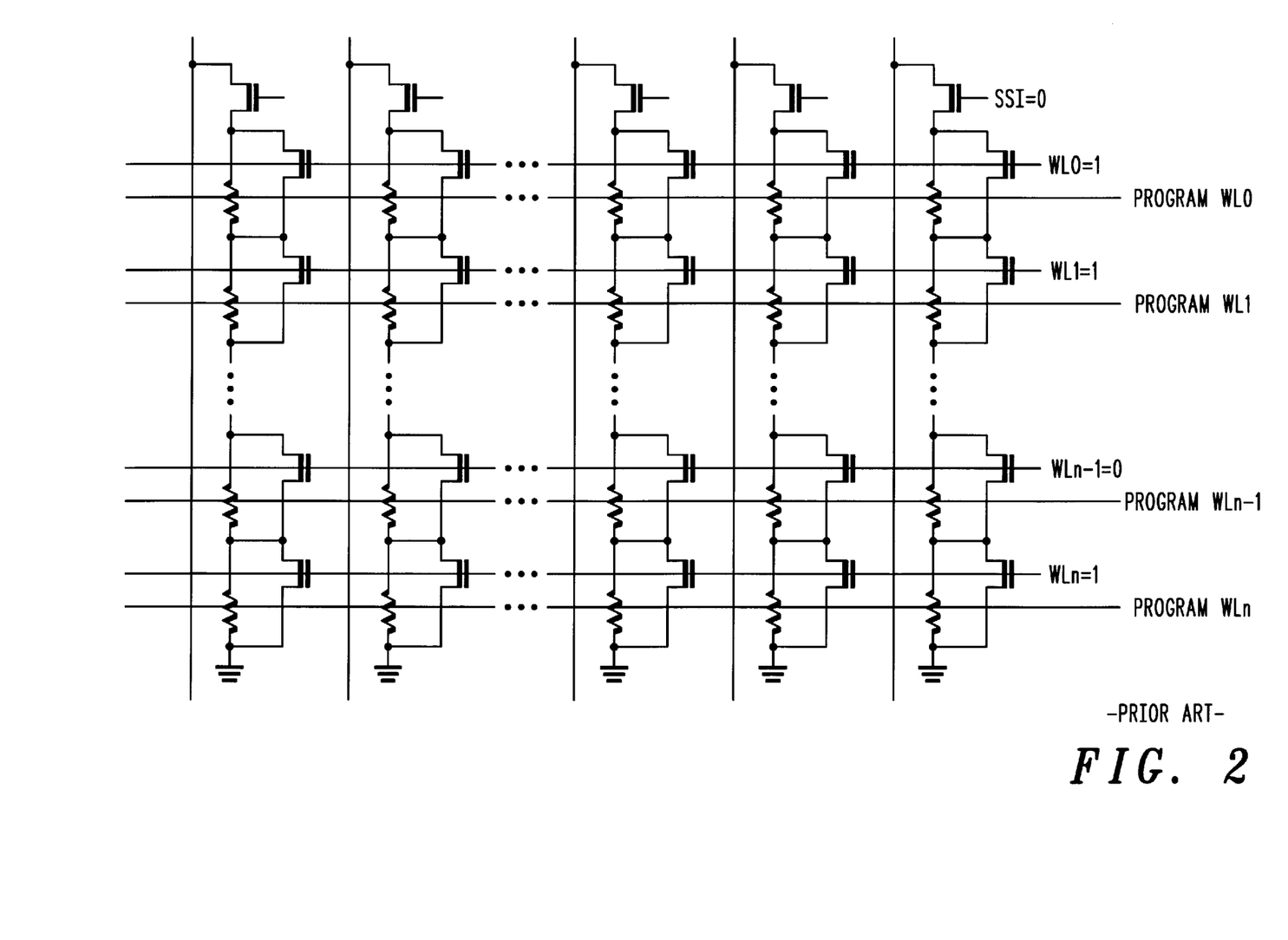
FIG. 2 is a schematic diagram of a prior art MTJ memory array, portions thereof removed, illustrating row and column connections.

In an architecture disclosed in U.S. Pat. No. 5,894,447, each MTJ cell in a column is connected in parallel with its associated control transistor, as illustrated in FIG. 2. In this architecture, each MTJ cell in a column is connected in parallel with its associated control transistor and groups of MTJ cells are connected in series, with an additional group select transistor, between a column bitline and ground. The gates of group select transistors are connected in rows to group select lines.

To read a bit of stored data, a column select transistor (not shown) is activated to select a specific bitline. A selected group line is activated and all wordlines in that group are activated except the wordline associated with the selected MTJ cell. Thus, all of the transistors in the group, except the transistor associated with the selected MTJ cell, are turned on to act as a short circuit across all of the MTJ cells in the group, except the selected MTJ cell. Since all of the MTJ cells, except the selected MTJ cell have a short circuit (an active transistor) across them, only the resistance of the unshorted selected MTJ cell will be sampled.

A program word line is associated with each MTJ cell in a row. In a programming operation for the architecture of FIG. 2, a MTJ cell is selected, generally as described in the read operation above, and programming current is supplied to the selected MTJ cell through the associated program word line. The combination of the currents in the associated bitline and wordlines produces a magnetic field at the selected MTJ cell which directs the magnetic vector in the free magnetic layer in the correct direction. One major problem in this type of architecture is that the wordlines, and in some instances the bitlines, are formed in the integrated circuit as polysilicon. Lines formed of polysilicon have a relatively high resistance and substantially increase the power required during reading and programming operations. Also, because of the high resistance and the fact that an MTJ cell and the long lines result in a relatively high capacitance, the RC time constant of each cell is relatively high resulting in substantially lower operating speeds.

Figure 3:
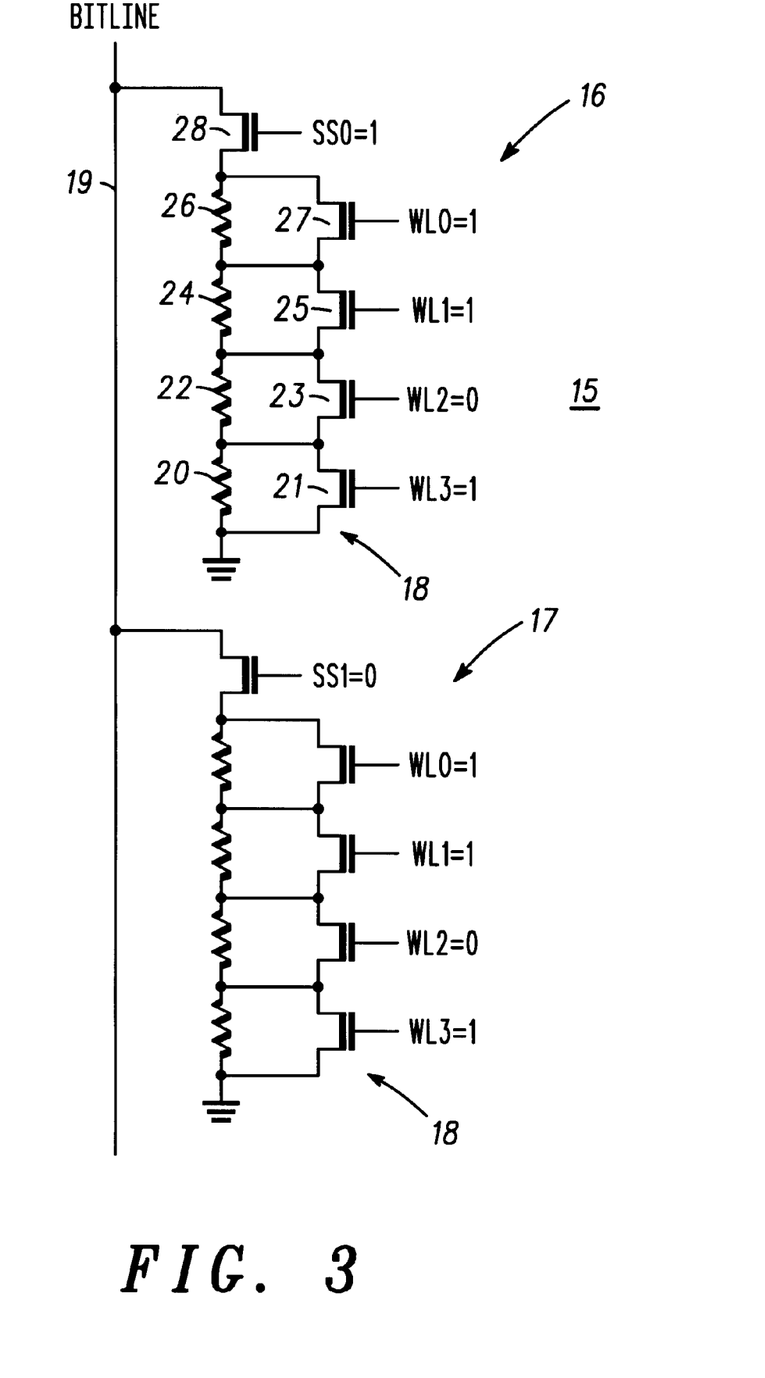
FIG. 3 is a schematic diagram of an MTJ memory array, portions thereof removed, connected in a series-parallel architecture in accordance with the present invention.

Turning now to FIG. 3, a schematic diagram is illustrated of a series-parallel architecture in accordance with the present invention. Only a single column 15 of an MTJ array with two series groups 16 and 17 of MTJ memory cells 18 is illustrated for ease of understanding. Each MTJ memory cell 18 includes a magnetic tunnel junction connected in parallel with a control transistor. Column 15 includes a global bit line 19 and MTJ cells 18 of each group of cells 16 and 17 are connected in series between global bit line 19 and a reference potential such as ground. Each group of cells 16 and 17 is connected in parallel to global bit line 19 by a group select transistor 28. Corresponding group select transistors 28 in the columns of the array are connected in rows and memory cells 18 are arranged in rows with the control electrodes of the control transistors in memory cells 18 connected in rows by control lines, hereinafter referred to as word lines.

Here it should be specifically noted that only a selected group of cells 16 or 17 will be connected to global bit line 19 at any specific instance. Thus, the bit line capacitance is drastically reduced as compared to architectures such as that illustrated in FIG. 1. This drastic reduction in bit line capacitance substantially increases the operation of MTJ RAMs with the seriesparallel architecture.

Because each of the groups of cells operates and is constructed in a similar fashion, only group 16 will be described in more detail at this time. Group 16 has a first MTJ cell 20 having one side connected to ground and a control transistor 21 connected in parallel thereto. A second MTJ cell 22 has one side connected to the opposite side of MTJ cell 20 and a control transistor 23 connected in parallel thereto. A third MTJ cell 24 has one side connected to the opposite side of MTJ cell 22 and a control transistor 25 connected in parallel thereto. A fourth MTJ cell 26 has one side connected to the opposite side of MTJ cell 24 and a control transistor 27 connected in parallel thereto. A group select transistor 28 connects the opposite side of fourth MTJ cell 26 to global bit line 19. The control terminals of control transistors 21, 23, 25, and 27 are connected to word lines designated $WL_0$ through $WL_{n-1}$.

Figure 4:
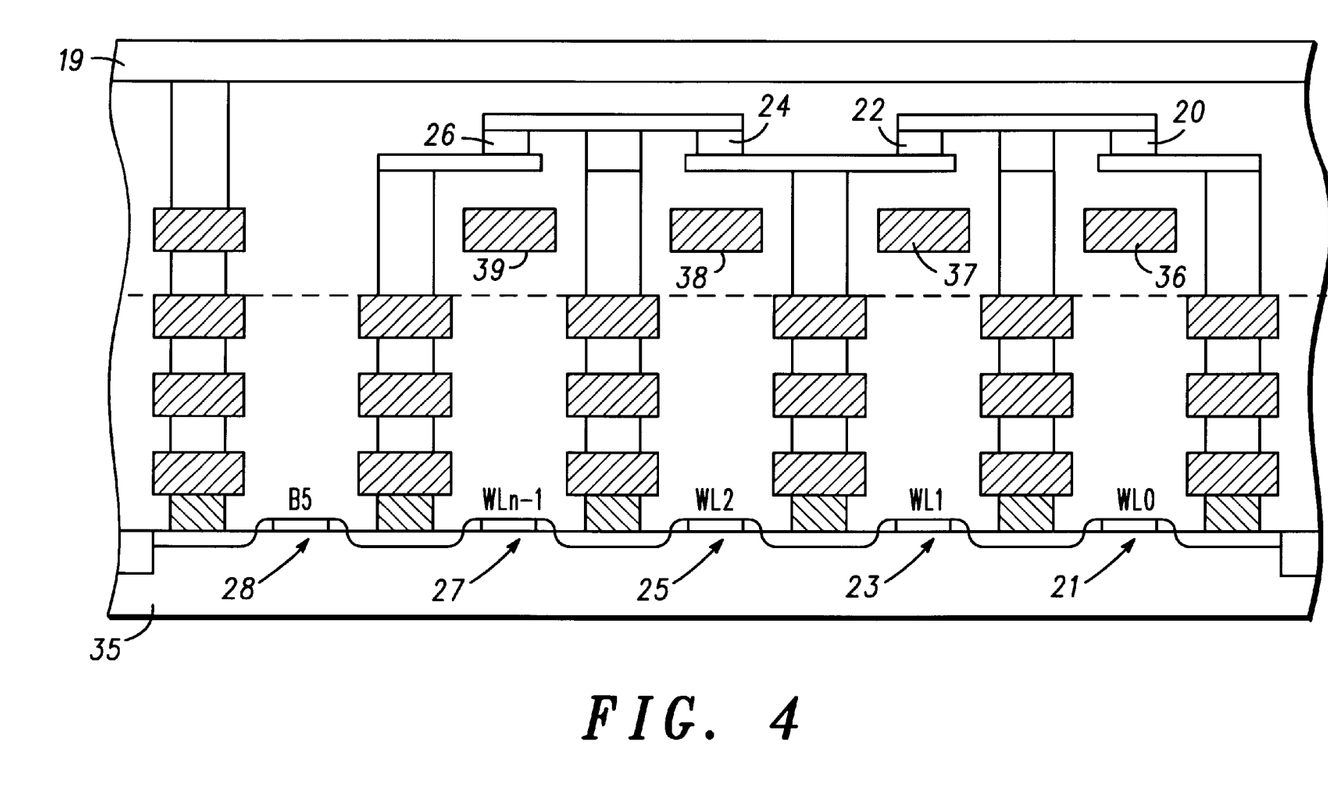
FIG. 4 is a sectional view of a portion of the MTJ array of FIG. 3 illustrating metallization layers and vias integrating the control electronics on a semiconductor substrate.

The entire MTJ memory array and associated electronic circuitry is fabricated on a semiconductor substrate 35. Referring additionally to FIG. 4, a cross-sectional view illustrates metallization layers and vias integrating the control electronics and MTJ cells of group 16 of FIG. 3 on semiconductor substrate 35. Control transistors 21, 23, 25, and 27 and select transistor 28 are formed in substrate 35 using standard semiconductor techniques. Word lines $WL_0$ through $WL_{n-1}$ are formed and operate as the gate terminals for control transistors 21, 23, 25, and 27 as well as continuing into and out of the figure to form wordlines. A bit select line BS is formed in the same metallization step and also serves as the gate terminal for select transistor 28.

Vias and interconnect lines (illustrated as T-shaped structures) are formed in subsequent metallization steps to interconnect MTJ cells 20, 22, 24, and 26 into bitline 19 and to opposite terminals of associated control transistors 21, 23, 25, and 27. Programming wordlines 36 through 39 are formed in a subsequent metallization step so as to be closely positioned relative to MTJ cells 20, 22, 24, and 26, respectively. In a final metallization step, column lines or global bit lines 19 are formed generally perpendicular to the programming word lines, one for each row (or column) of MTJ cells. Here it should be understood that each bitline 19 can be referred to as a global bit line, since each group of cells 16, 17, etc. is connected in series to a bit line 19, which thereby connects all of the groups of MTJ cells in a column.

For additional information as to the construction and operation of the structure illustrated in FIG. 4, refer to a copending application filed of even date herewith, entitled "High Density MRAM Cell Array", assigned to the same assignee, and incorporated herein by reference. In the specific embodiment illustrated in FIG. 4, programming wordlines 36–39 are positioned below MTJ cells 20, 22, 24, and 26, respectively, so that column lines 19 can be positioned in closer proximity to MTJ cells 20, 22, 24, and 26, thereby reducing the required programming current and magnetic interaction with adjacent rows (or columns).

Figure 5:
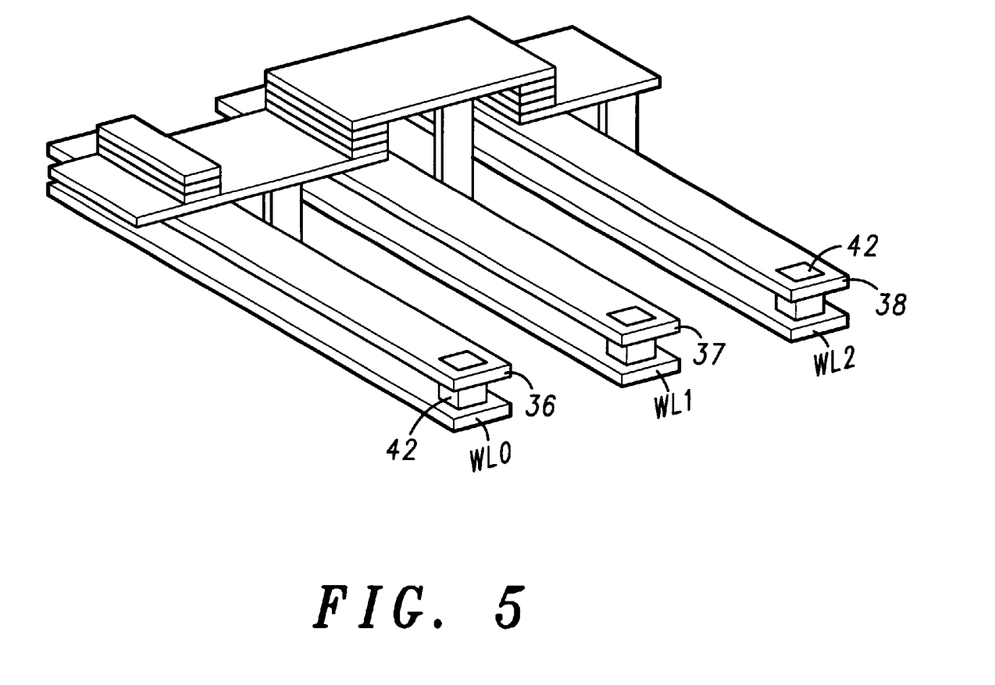
FIG. 5 is an isometric view of the MTJ memory array of FIG. 4, portions thereof removed, connected in a series-parallel architecture in accordance with the present invention.

Referring additionally to FIG. 5, an isometric view of the MTJ memory array of FIG. 4 is illustrated. As can be seen most clearly by referring back to FIG. 4, wordlines $WL_0$ through $WL_{n-1}$ are formed during the formation of transistors 21, 23, 25, and 27. Because of the specific process generally used in the fabrication of this type of transistor, the gates and wordlines are formed of a doped polysilicon. The problem, as outlined above, is that polysilicon has a relatively high resistance and greatly increases the required operating power as well as reducing the operating speed of the MTJ memory array. In many integrated circuits this problem is reduced by metallizing the gates and wordlines, i.e. strapping the polysilicon wordline with an additional metal line. However, this strapping of the wordline substantially increases the size of the MTJ cell structure (MTJ cell and associated control transistor). The strapping of the wordlines at the gates of the control transistors requires several additional masking and etching steps and is difficult to control so that the additional steps and all subsequent steps in the process require additional chip real estate.

In the embodiment illustrated in FIGS. 4 and 5, the strapping problem is overcome by connecting the metal programming wordlines 36, 37, 38, and 39 to the polysilicon wordlines $WL_0$ through $WL_{n-1}$, respectively, at spaced apart intervals. These spaced connections are illustrated in FIG. 5 as vias 42. Since programming wordlines 36, 37, 38, and 39 are metal and parallel to polysilicon wordlines $WL_0$ through $WL_{n-1}$, the spaced connections greatly reduce the resistance of polysilicon wordlines $WL_0$ through $WL_{n-1}$. Further, the formation of programming wordlines 36, 37, 38, and 39 is much simpler than strapping polysilicon wordlines $WL_0$ through $WL_{n-1}$, since the position, size, etc. is much less critical than the formation of a metallized gate.

Figure 6:
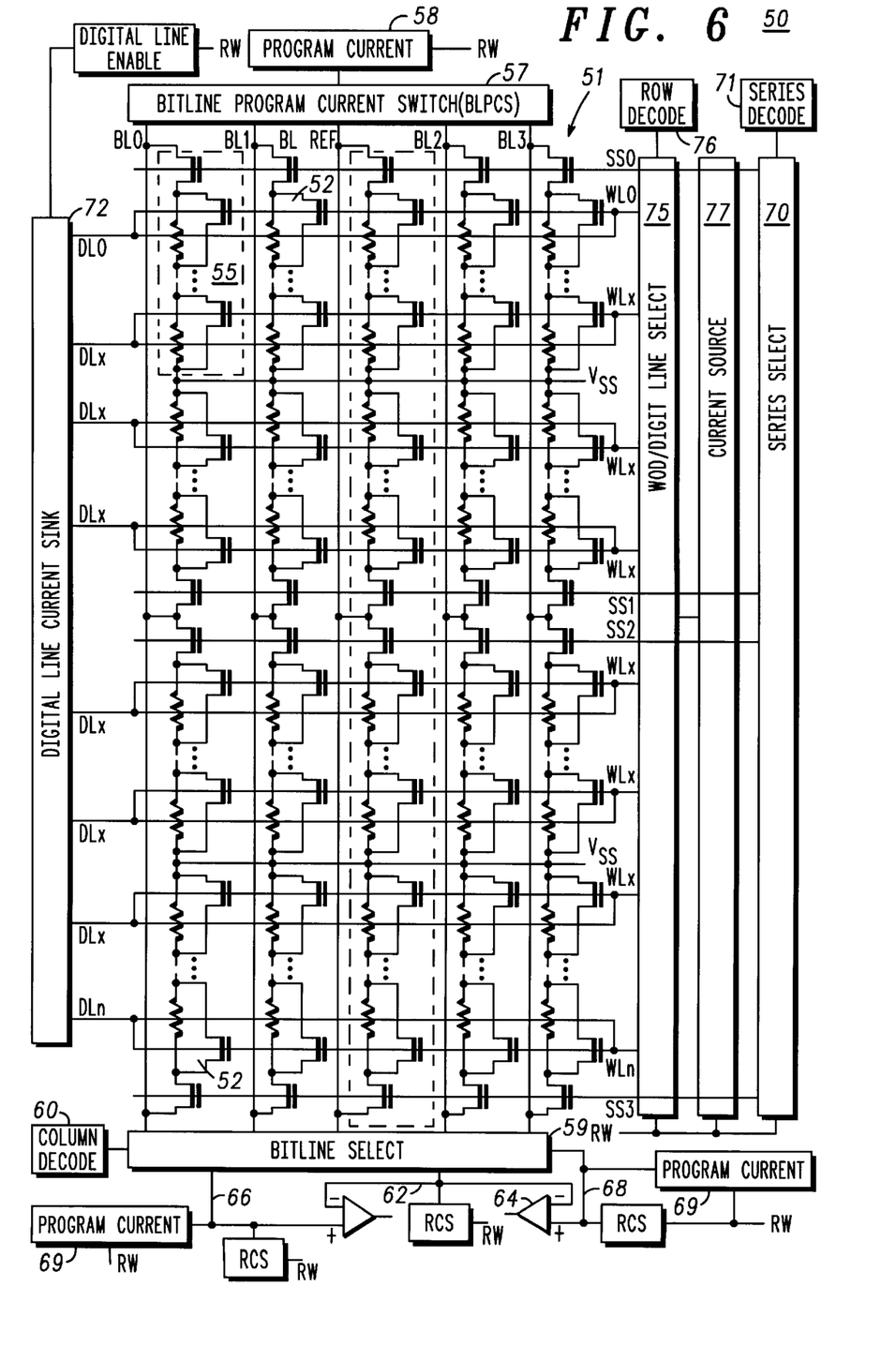
FIG. 6 is a schematic diagram of a MTJ RAM including circuits for reading/programming the series-parallel architecture.

Turning now to FIG. 6, a schematic diagram is illustrated of a MTJ RAM 50, including circuitry for reading/programming a MTJ memory array 51, connected in a series-parallel architecture in accordance with the present invention. Array 51 includes a plurality of MTJ cells and associated control transistors connected in parallel units designated 52 and arranged in rows and columns. A group n of units 52 are connected in series as a local bit line with a bit select transistor, an example of which is enclosed in a broken line and designated 55. Each column includes a plurality of groups 55 with the local bitlines connected in parallel to a global bitline BL0 through BL3. Here it should be noted that a centrally located column is constructed similar to the other columns but the global bit line is designated BLref for reasons that will be explained in more detail presently.

A bitline program current switch 57 is connected to one end of each of the global bitlines BL0 through BL3 and to a program current circuit 58 which is constructed to source or sink programming current in the bitlines. Global bitline BLref is not connected to program current circuit 58 since it is not programmed but is instead a constant reference. The opposite ends of global bitlines BL0 through BL3 are connected to a bitline select circuit 59 which has a column decode circuit 60 connected thereto for selecting a specific one of the global bitlines BL0 through BL3. The other end of the reference bitline BLref is connected to a reference data line 62, which is in turn connected to the negative inputs of comparators 63 and 64.

A first output of bitline select circuit 59 is connected to a junction 66, which is in turn connected to a program current circuit 67 constructed to source or sink programming current (opposite to circuit 58) in bitlines BL0 and BL1. Junction 66 is also connected to a positive input of comparator 63. Junction 66 is connected by circuit 59 to a selected one of global bitlines BL0 or BL1 so that the potential on the selected global bitline is compared to the potential on global bitline BLref in comparator 63. Similarly, a second output of bitline select circuit 59 is connected to a junction 68, which is in turn connected to a program current circuit 69 constructed to source or sink programming current (opposite to circuit 58) in bitlines BL2 and BL3. Junction 68 is also connected to a positive input of comparator 64. Junction 68 is connected by circuit 59 to a selected one of global bitlines BL2 or BL3 so that the potential on the selected global bitline is compared to the potential on global bitline BLref in comparator 64.

In addition to being arranged in columns and groups, as explained above, parallel units 52 and the bit select transistors in each group are arranged in rows. Each row of bit select transistors has a select line, designated SS0 through SS3, connecting the gates of the transistors to a series select circuit 70, which is in turn controlled by a series decode circuit 71. Each row of parallel units 52 has a digit (word programming) line, designated DL0 through DLn associated therewith, all of the digit lines being connected at one end to a digit line current sink 72. Also, each row of parallel units 52 has a wordline, designated $WL_0$ through $WL_n$, connected to the gates of each of the control transistors in units 52. The opposite ends of wordlines $WL_0$ through $WL_n$ are connected through a word/digit line select circuit 75, which is in turn controlled by a row decoder 76, to a current source 77. As explained above, wordlines $WL_0$ through $WL_n$ are connected to the associated digit lines $DL_0$ through $DL_n$, respectively, at spaced apart intervals.

Figure 7:
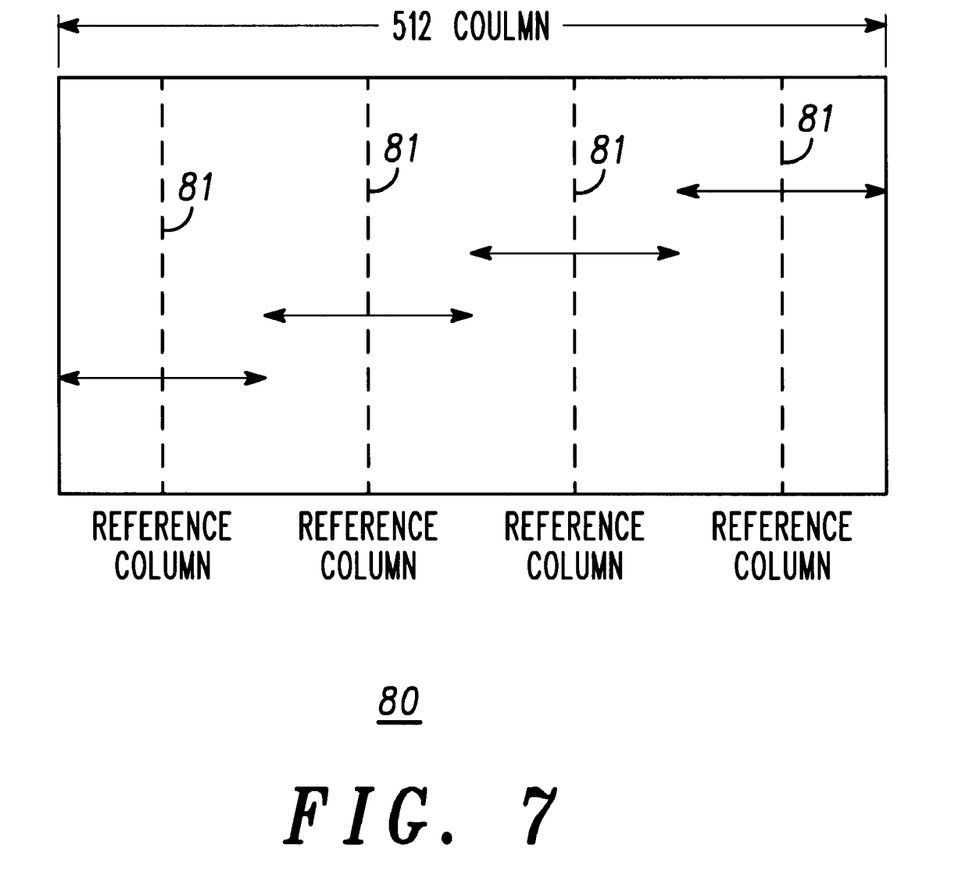
FIG. 7 illustrates an example of an MTJ memory array connected to incorporate the architecture of FIG. 6.

Referring additionally to FIG. 7, a MTJ RAM 80, similar to MTJ RAM 50 described above, is illustrated. In this specific example, RAM 80 includes 512 columns of MTJ cells and four reference columns 81. Each reference column 81 is positioned with 64 columns on each side and is connected so that each reference column 81 acts as a reference for 64 columns to the left and 64 columns to the right of each reference column 81. Such things as power supply current variations, process changes, temperature tracking process, voltage and temperature variations, could result in signal loss. Due to the architecture described in conjunction with FIG. 6, any variations in a selected MTJ cell in the left 64 columns and its parallel transistor in the right 64 columns will also be present to substantially the same magnitude in the reference MTJ cell located in the same row along a word/digit line. Once the variations are presented to the comparator differentially they will be treated as common-mode and rejected.

One of the major drawbacks in series connected MTJ cells, such as those illustrated and described in conjunction with FIG. 2, is the difficulty in obtaining differential detection of the data. This difficulty is due primarily to the fact that the voltages of each cell in a group of MTJ cells will vary slightly depending on the MTJ cell which is being accessed. Theoretically, each MTJ cell has an equal voltage drop thereacross, however, this is not possible in a real micro fabrication process. The architecture described in conjunction with FIG. 6 overcomes this problem by comparing MTJ cells to a constant reference produced by a MTJ reference cell in the same position as the selected MTJ cell. Because of the relative positions of the selected MTJ cells and the reference MTJ cells, the reference will be substantially constant and differential detection of the data can be relatively accurately achieved.

Furthermore, the voltage across an MTJ cell is determined by the bias applied across the MTJ cell, which in turn controls the MR. It is important that the selected and reference MTJ cells have very close bias voltages across them. This is accomplished in the architecture described in conjunction with FIG. 6, since the selected and reference MTJ cells occupy the same position in the selected and reference columns. Also, any input noise introduced onto the data lines and bitlines will be present on both reference and bitlines and will be rejected by the comparators as common mode, this is especially true for low frequency noise.

Figure 8:
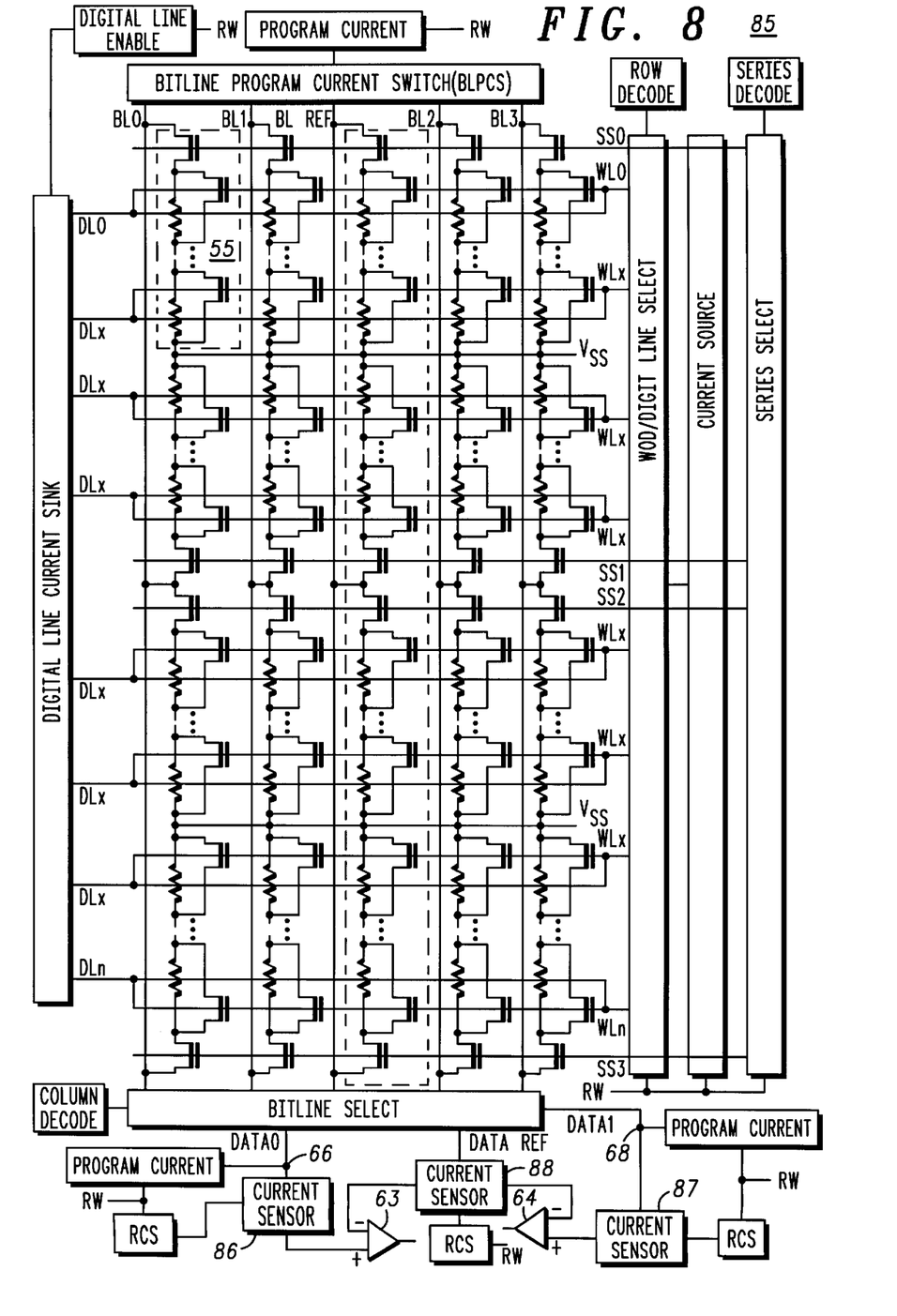
FIG. 8 is a schematic diagram of a MTJ RAM including other circuits for reading/programming a series-parallel architecture.

Turning now to FIG. 8, a schematic diagram of an MTJ RAM 85 is illustrated. RAM 85 is similar to RAM 50 of FIG. 6 except that a current sensor 86 is included between the first data output (junction 66) and comparator 63. Also, a current sensor 87 is included between the second data output (junction 68) and comparator 64 and a current sensor 88 is connected between the end of bitline BLref and the negative inputs of comparators 63 and 64. Current sensors 86, 87, and 88 are similar to current conveyors described in a copending application filed Mar. 31, 2000, with U.S. Ser. No. 09/540,794, entitled "Current Conveyor and Method for Readout of MTJ Memories", assigned to the same assignee and incorporated herein by reference. Because of the current conveyors, circuit operation and output signals are independent of all process, supply, temperature, and MTJ resistance conditions. Also, because of the current conveyors, voltage swings on data lines or bitlines are virtually eliminated so that the speed of the readout process is greatly increased. Further, the current conveyors operate as a current-voltage converter to improve the operation and the voltage is amplified, to improve readout characteristics.

Figure 9:
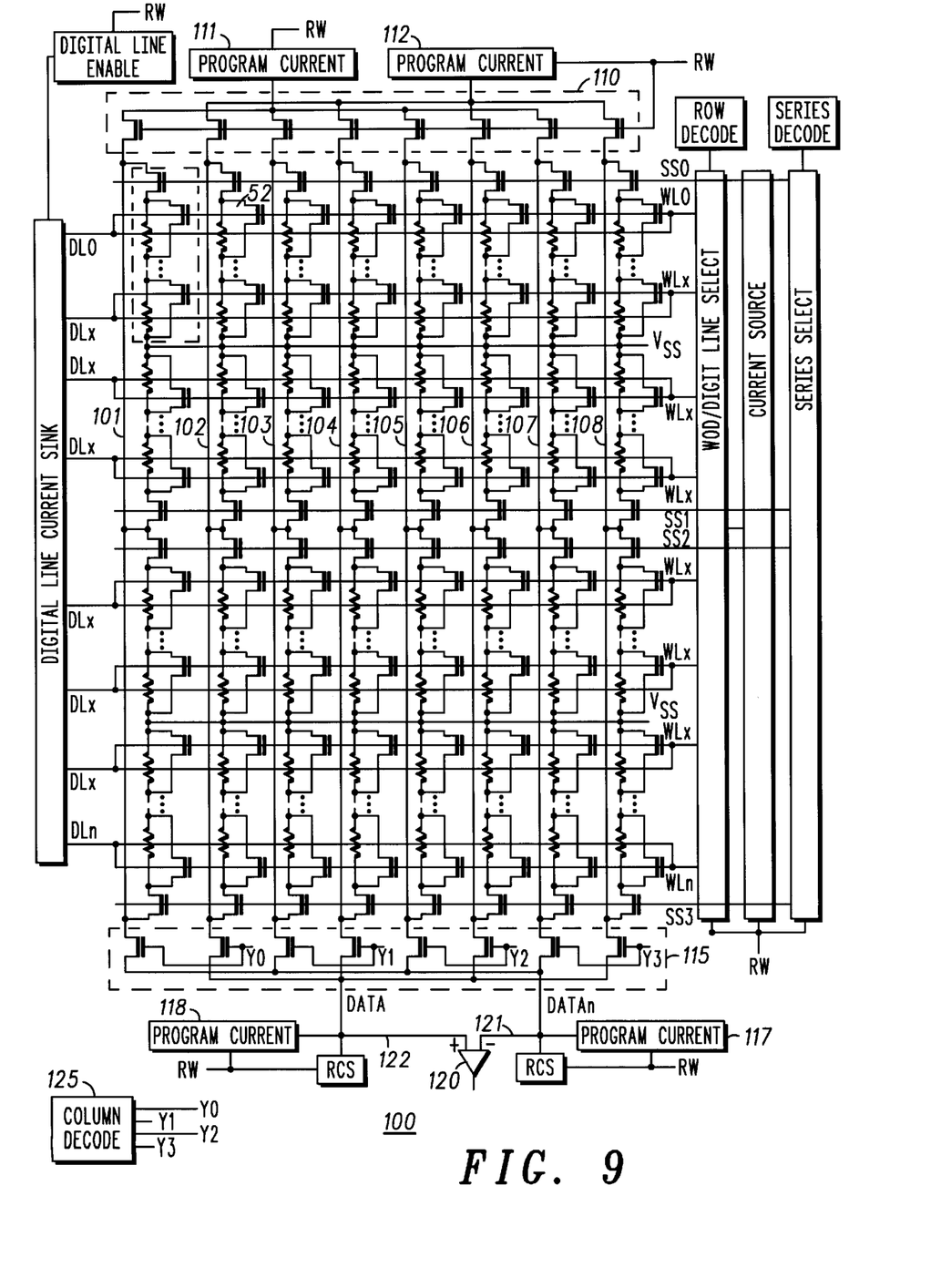
FIG. 9 is a schematic diagram of another MTJ memory array architecture in accordance with the present invention.

Referring to FIG. 9, another architecture 100 for an MTJ memory array in accordance with the present invention is illustrated. In this embodiment, the MTJ array and row electronics are basically similar to the structure disclosed in conjunction with FIG. 6. The difference in architecture 100 is in the connection of the column electronics and the method of reading stored data. For convenience in understanding, the MTJ array includes eight columns which are numbered consecutively 101 through 108.

The upper end of each global bit line for columns 101 through 108 is coupled to a switching transistor and the eight switching transistors herein form the bitline program current switch 110 controlled by a read/write circuit, designated RW. Switch 110 is designed to connect the global bit lines of columns 101, 103, 105, and 107 to a program current source/sink circuit 112 and the global bit lines of columns 102, 104, 106, and 108 to a program current source/sink circuit 114. Source/sink circuits 112 and 114 are also controlled by read/write circuit RW.

The lower end of each global bit line for columns 101 through 108 is coupled to another switching transistor and the eight switching transistors herein form a bitline select circuit, designated 115. Select circuit 115 is designed to connect the global bit lines of columns 101, 103, 105, and 107 to a program current source/sink circuit 117 and the global bit lines of columns 102, 104, 106, and 108 to a program current source/sink circuit 118. Source/sink circuit 117 operates in conjunction with source/sink circuit 112 and source/sink circuit 118 operates in conjunction with source/sink circuit 114 to provide read and appropriate programming currents to columns 101 through 108. A comparator circuit 120 has a first input terminal 121 connected through select circuit 115 to the lower ends of the global bit lines of columns 101, 103, 105, and 107. Comparator circuit 120 has a second input terminal 122 connected through select circuit 115 to the lower ends of the global bit lines of columns 102, 104, 106, and 108.

A column decode circuit 125 is connected to select circuit 115 so that two columns in proximity but with different current sources and different output circuits are activated simultaneously. In this embodiment, for example, a first output signal Y0 from decode circuit 125 activates the switching transistors at the lower end of the global bit line of columns 101 and 102. A second output signal Y1 from decode circuit 125 activates the switching transistors at the lower end of the global bit line of columns 103 and 104. A third output signal Y2 from decode circuit 125 activates the switching transistors at the lower end of the global bit line of columns 105 and 106. A fourth output signal Y3 from decode circuit 125 activates the switching transistors at the lower end of the global bit line of columns 107 and 108.

Thus, during the read operation, two columns in close proximity are simultaneously connected to opposite input terminals of comparator 120. Comparator 120 then differentially compares the stored bits in the associated pairs of columns. Because of the series-parallel connection of the MTJ array, each column can have virtually any number of local bit lines and each local bit line can include virtually any number of MTJ cells connected in series. In this specific example, each MTJ cell in one column (e.g., column 101) will have opposite data to that stored in the corresponding MTJ cell in the associated column (in this example, column 102). Because of the differential comparison of two opposite stored bits, the amount of signal available for readings is effectively doubled, since the available signal does not have to be divided into two to establish a reference level, which is the case in MRAM memories with non-differential sensing. Also, any mismatch between the two MTJ cells being compared will be very small due to the close proximity and identical characteristics of the compared cells. Furthermore, the differential comparisons will be insensitive to variations between the switching transistors in associated columns, as well as voltage and temperature variations and common noise, since the variations and common noise will be present in both columns so as to be processed as common mode by differential comparator 120.

Throughout this disclosure the terms "column" and "row" have been used to describe a specific orientation. It should be understood, however, that these terms are used only to facilitate a better understanding of the specific structure being described and are in no way intended to limit the invention. As will be understood by those skilled in the art columns and rows can be easily interchanged and it is intended in this disclosure that such terms be interchangeable. Also, specific names of the various lines, e.g., bitline, wordline, digit line, select line, program line, etc. are intended to be generic names used only to facilitate the explanation and are not intended to in any way limit the invention.

Thus, a new and improved architecture for MTJ RAMs is disclosed. The new and improved architecture makes reliable operation of the RAM possible. Further, because of the layout of each bit in the MTJ array, the cell size is smaller resulting in higher density arrays. Also, because of the novel word and digit line connections the operation speed is substantially improved and the operating power is reduced.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Magnetic tunnel junction random access memory architecture comprising:

an array of memory cells arranged in rows and columns, each memory cell including a magnetic tunnel junction and a control transistor connected in parallel, each control transistor including a control terminal;

a control line connected to the control terminal of each control transistor in a row of control transistors;

a metal programming line extending adjacent to each magnetic tunnel junction in the row; and a plurality of vias connecting the metal programming line to the control line at spaced apart intervals.

2. Magnetic tunnel junction random access memory architecture as claimed in claim 1 wherein the control transistors are formed in a semiconductor substrate and the control line is formed integrally with the control terminals of the control transistors.

3. Magnetic tunnel junction random access memory architecture as claimed in claim 2 wherein the control line is formed of a doped polycrystalline semiconductor material.

4. Magnetic tunnel junction random access memory architecture as claimed in claim 1 wherein the array of memory cells includes a plurality of columns with each column including a global bit line coupled to a control circuit, each column including a plurality of groups of memory cells, each group including a plurality of memory cells connected in series between the global bit line and a reference potential so as to form a local bit line, with each local bit line including a control transistor.

5. Magnetic tunnel junction random access memory architecture as claimed in claim 4 wherein the control transistors in the local bit lines are arranged in rows and each include a control terminal, with each row of control transistors having a select line attached to the control terminal of each control transistor in the row and to a control circuit.

6. Magnetic tunnel junction random access memory architecture as claimed in claim 5 further including output circuitry having a comparator with a pair of input terminals and switching circuitry connecting two different columns to the pair of input terminals, respectively, so as to differentially compare output signals from the two different columns.

7. Magnetic tunnel junction random access memory architecture as claimed in claim 5 wherein a reference column of memory cells, including a global bit line and local bit lines, is connected to provide a reference signal output, an output circuit includes a first and a second comparator circuit each having a first input terminal connected to receive the reference signal output and a second input terminal connected to receive a data output signal from at least one global bit line on each opposite side of the reference column, respectively.

8. Magnetic tunnel junction random access memory architecture as claimed in claim 7 wherein the array of memory cells includes a plurality of spaced apart reference columns of memory cells each providing a reference signal output, the output circuit being coupled to compare the data output signals of a plurality of the global lines on a first side of each of the reference columns to the reference signal and a plurality of the global lines on a second side of each of the reference columns of each of the reference columns and the data output signals of a plurality of the global lines on a second side of each of the reference columns to the reference signal.

9. Magnetic tunnel junction random access memory architecture comprising:

an array of memory cells arranged in rows and columns, each memory cell including a magnetic tunnel junction and a control transistor connected in parallel, each control transistor including a control terminal;

the array of memory cells including a plurality of columns with each column including a global bit line coupled to a control circuit, each column further including a plurality of groups of memory cells with each group including a plurality of memory cells connected in series between the global bit line and a reference potential so as to form a local bit line, and each local bit line including a control transistor;

a reference column of memory cells, including a global bit line and local bit lines, connected to provide a reference signal output; and an output circuit including a first and a second comparator circuit each having a first input terminal connected to receive the reference signal output and a second input terminal connected to receive a data output signal from at least one global bit line on each opposite side of the reference column, respectively, the first comparator circuit comparing the data output signal from a global bit line on one side of the reference column to the reference signal output and the second comparator circuit comparing the data output signal from a global bit line on an opposite side of the reference column to the reference signal output.

10. Magnetic tunnel junction random access memory architecture as claimed in claim 9 further including a control line connected to the control terminal of each control transistor in a row of control transistors and circuitry coupled to the control line for selecting a local bit line of each global bit line and the reference column.

11. Magnetic tunnel junction random access memory architecture as claimed in claim 10 further including a metal programming line extending adjacent to each magnetic tunnel junction in the row and a plurality of vias connecting the metal programming line to the control line at spaced apart intervals.

12. Magnetic tunnel junction random access memory architecture as claimed in claim 11 wherein the control transistors are formed in a semiconductor substrate and the control line is formed integrally with the control terminals of the control transistors.

13. Magnetic tunnel junction random access memory architecture as claimed in claim 12 wherein the control line is formed of a doped polycrystalline semiconductor material.

14. Magnetic tunnel junction random access memory architecture comprising:

an array of memory cells arranged in rows and columns, each memory cell including a magnetic tunnel junction and a control transistor connected in parallel, each control transistor including a control terminal;

the array of memory cells including a plurality of columns of memory cells with each column including a global bit line coupled to a control circuit, each column further including a plurality of groups of memory cells with each group including a plurality of memory cells connected in series between the global bit line and a reference potential so as to form a local bit line, and each local bit line including a control transistor;

one of the columns of memory cells being connected as a reference column including a global bit line and local bit lines, the reference column being further connected to provide a reference signal output from a selected local bit line of the reference column;

the control transistors in the local bit lines being arranged in rows and each control transistor including a control terminal, each row of control transistors having a select line attached to the control terminal of each control transistor in the row and to a control circuit for selecting a local bit line of each global bit line and the reference column; and an output circuit including a first and a second comparator circuit each having a first input terminal connected to receive the reference signal output and a second input terminal connected to receive a data output signal from at least one global bit line on each opposite side of the reference column, respectively, the first comparator circuit comparing the data output signal from a global bit line on one side of the reference column to the reference signal output and the second comparator circuit comparing the data output signal from a global bit line on an opposite side of the reference column to the reference signal output.

15. Magnetic tunnel junction random access memory architecture as claimed in claim 14 further including a metal programming line extending adjacent to each magnetic tunnel junction in the row and a plurality of vias connecting the metal programming line to the control line at spaced apart intervals.

16. Magnetic tunnel junction random access memory architecture as claimed in claim 15 wherein the control transistors are formed in a semiconductor substrate and the control line is formed integrally with the control terminals of the control transistors.

17. Magnetic tunnel junction random access memory architecture as claimed in claim 16 wherein the control line is formed of a doped polycrystalline semiconductor material.

18. Magnetic tunnel junction random access memory architecture as claimed in claim 14 wherein the output circuit includes a first current sensor connected to the first input terminals of the first and second comparator circuits to receive the reference signal output and second and third current sensors connected to the second input terminals of the first and second comparator circuits to receive the data output signal from the at least one global bit line on each opposite side of the reference column.

19. Magnetic tunnel junction random access memory architecture comprising:

an array of memory cells arranged in rows and columns, each memory cell including a magnetic tunnel junction and a control transistor connected in parallel, each control transistor including a control terminal;

the array of memory cells including a plurality of columns of memory cells with each column including a global bit line coupled to a control circuit, each column further including a plurality of groups of memory cells with each group including a plurality of memory cells connected in series between the global bit line and a reference potential so as to form a local bit line, and each local bit line including a control transistor;

the control transistors in the local bit lines being arranged in rows and each control transistor including a control terminal, each row of control transistors having a select line attached to the control terminal of each control transistor in the row and to a control circuit for selecting a local bit line of each global bit line; and an output circuit including column select circuitry and a differential comparator circuit having a first input terminal connected through the column select circuitry to receive a first data output signal from a first global bit line and a second input terminal connected through the column select circuitry to receive a second data output signal from a second global bit line, the comparator circuit differentially comparing the first and second data output signals.

20. Magnetic tunnel junction random access memory architecture as claimed in claim 19 wherein memory cells coupled to the first global bit line and memory cells coupled to the second global bit line are connected to have opposite data stored therein.

21. Magnetic tunnel junction random access memory architecture as claimed in claim 19 further including a metal programming line extending adjacent to each magnetic tunnel junction in the row and a plurality of vias connecting the metal programming line to the control line at spaced apart intervals.

22. Magnetic tunnel junction random access memory architecture as claimed in claim 21 wherein the control transistors are formed in a semiconductor substrate and the control line is formed integrally with the control terminals of the control transistors.

23. Magnetic tunnel junction random access memory architecture as claimed in claim 22 wherein the control line is formed of a doped polycrystalline semiconductor material.

* * * * *

UNITED STATES PATENT AND TRADEMARK OFFICE
CERTIFICATE OF CORRECTION

PATENT NO. : 6,331,943 B1
DATED : December 18, 2001
INVENTOR(S) : Naji et al.

It is certified that error appears in the above-identified patent and that said Letters Patent is hereby corrected as shown below:

<u>Column 1,</u>
Line 3, after the title, please add as a new first paragraph the following paragraph:
-- This invention was made with Government support under Agreement No. MDA972-96-3-0016 awarded by DARPA. The Government has certain rights in the invention. --

Signed and Sealed this

Twenty-first Day of October, 2003

JAMES E. ROGAN
*Director of the United States Patent and Trademark Office*